(12) United States Patent
Yoon

(10) Patent No.: US 8,796,088 B2
(45) Date of Patent: Aug. 5, 2014

(54) SEMICONDUCTOR DEVICE AND METHOD OF FABRICATING THE SAME

(75) Inventor: Chul Jin Yoon, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 51 days.

(21) Appl. No.: 13/545,274

(22) Filed: Jul. 10, 2012

(65) Prior Publication Data

US 2013/0134526 A1 May 30, 2013

(30) Foreign Application Priority Data

Nov. 28, 2011 (KR) .................. 10-2011-0125199

(51) Int. Cl.
*H01L 29/78* (2006.01)

(52) U.S. Cl.
USPC ........... 438/245; 438/222; 438/341; 438/360; 438/223; 438/224; 438/225; 438/226; 438/286; 438/339; 438/299; 438/244; 438/335; 438/363; 438/401; 438/975; 257/409; 257/408; 257/390; 257/368; 257/471; 257/E21.409; 257/E29.134; 257/E29.255; 257/E21.507; 257/E29.338; 257/48; 257/797; 257/283; 257/332; 257/340; 257/E23.179; 257/E21.433; 257/E21.435; 257/E21.443

(58) Field of Classification Search
CPC ............ H01L 21/743; H01L 21/76264; H01L 21/763; H01L 29/66287; H01L 29/66242; H01L 21/8249; H01L 29/66272; H01L 29/732; H01L 21/823892; H01L 27/0922; H01L 29/66659; H01L 29/7835; G02B 6/136
USPC ......... 438/589, 401, 637, 222, 223, 224, 225, 438/226, 227, 228, 245, 341, 360, 975; 257/409, 408, 390, 368, 471, 77, 620, 257/48, 282, 283, 332, 340, 797, E23.179, 257/E21.433, E21.435, E21.443
See application file for complete search history.

(56) References Cited

U.S. PATENT DOCUMENTS

| | | | |
|---|---|---|---|
| 7,687,388 B2* | 3/2010 | Ha ................................ | 438/589 |
| 7,795,136 B2* | 9/2010 | Park .............................. | 438/637 |
| 7,825,494 B2* | 11/2010 | Jun ................................ | 257/620 |
| 2004/0256675 A1* | 12/2004 | McNeil ......................... | 257/355 |
| 2006/0186479 A1* | 8/2006 | Seo et al. ...................... | 257/368 |
| 2008/0160714 A1* | 7/2008 | Shim et al. .................... | 438/401 |
| 2009/0309169 A1* | 12/2009 | Wu ................................ | 257/390 |
| 2010/0244152 A1* | 9/2010 | Bahl et al. ..................... | 257/408 |
| 2011/0073962 A1* | 3/2011 | Chu et al. ...................... | 257/408 |
| 2011/0272011 A1* | 11/2011 | Lochtefeld et al. ........... | 136/255 |
| 2012/0280251 A1* | 11/2012 | Dube et al. ..................... | 257/77 |

FOREIGN PATENT DOCUMENTS

KR 10-2008-0083161 9/2008

* cited by examiner

*Primary Examiner* — Jerome Jackson, Jr.
*Assistant Examiner* — Bo Fan
(74) *Attorney, Agent, or Firm* — Sherr & Jiang, PLLC

(57) ABSTRACT

A semiconductor device and a method of fabricating the semiconductor device is provided. In the method, a semiconductor substrate defining a device region and an outer region at a periphery of the device region is provided, an align trench is formed in the outer region, a dummy trench is formed in the device region, an epi layer is formed over a top surface of the semiconductor substrate and within the dummy trench, a current path changing part is formed over the epi layer, and a gate electrode is formed over the current path changing part. When the epi layer is formed, a current path changing trench corresponding to the dummy trench is formed over the epi layer, and the current path changing part is formed within the current path changing trench.

9 Claims, 7 Drawing Sheets

SEMICONDUCTOR DEVICE AND METHOD OF FABRICATING THE SAME

The present application claims priority under 35 U.S.C. 119 to Korean Patent Application No. 10-2011-0125199 (filed on Nov. 28, 2011), which is hereby incorporated by reference in its entirety.

BACKGROUND

Embodiments relate to a semiconductor device and a method of fabricating the semiconductor device. Relatively high voltage devices may be used as core parts in semiconductor devices for vehicles, networks, and display driving technologies. For example, a 15V-grade bidirectional relatively high voltage device may be integrated with a relatively low voltage device in the same chip. The 15V-grade bidirectional relatively high voltage device may be used in an output end of a data driver integrated circuit (IC) device of a liquid crystal display (LCD) or organic light emitting diode (OLED) display.

For example, if a driver IC device for a display has 240 to 640 terminals in a single output end, uniformity of the terminals may directly effect image uniformity of the display. In some applications, it may be important that an output end of a driver IC device has substantially uniform electrical characteristics.

Some high voltage devices may be n type metal oxide semiconductor (NMOS) transistors. Such design of NMOS transistor may include a source and a drain disposed in an n type drift region within a p type well on a substrate, and a gate may be disposed on a gate dielectric layer. Spacers may be disposed on at least one of the side walls of the gate. An NMOS transistor may be electrically connected to an external device through a source electrode, a gate electrode, and a drain electrode, which may be insulated by an interlayer dielectric layer.

A process of fabricating a relatively high voltage NMOS device may include at least one of: (1) A wafer as a substrate may be prepared. (2) A mask pattern for forming a high voltage (HV) well may be formed over the substrate. (3) P type impurity ions may be implanted into the substrate. (4) A relatively high voltage p type well may be formed through a drive-in process at relatively high temperature (e.g., 1200° C.) in order to diffuse the implanted impurity ions and to fabricate a semiconductor device having a relatively high breakdown voltage. (5) Another mask pattern for forming a drift region may be formed. N type impurity ions may be implanted into the substrate through the mask pattern. (6) N type drift region may be formed within the relatively high voltage p type well through a relatively high temperature drive-in process for maximizing a breakdown voltage.

In some designs, a well region and a drift region may be formed for a relatively high voltage NMOS device. A process of fabricating a relatively low voltage device on the same wafer may be also performed. For example, a device isolation oxide layer may be formed on a substrate (e.g. through a local oxidation of silicon (LOCOS) process) and a relatively low voltage (LV) well pattern may be formed. Then, ions may be implanted into the substrate through the low voltage (LV) well pattern to form a low voltage well.

Relatively high voltage devices are required to have relatively a minimum channel resistance and resist some breakdown voltage. Referring to FIGS. 9 and 10, in some designs, a field-plate-on-oxide structure may be used to maximize breakdown voltage. Referring to FIG. 9, a shallow trench isolation (STI) structure may be used to form a field-plate-on-oxide structure. In some designs, a current path may be maximized by the depth of the STI structure, so as to maximize on-resistance (Ron). Referring to FIG. 10, a dielectric layer that is relatively thin (compared to an STI structure) may be used to form a field-plate-on-oxide structure. In some designs, additional processes may be required.

SUMMARY

Embodiments relate to a semiconductor device and a method of fabricating a semiconductor device that has maximized breakdown characteristics and resistance characteristics, and that may be efficiently fabricated.

In embodiments, a method of fabricating a semiconductor device may include at least one of: (1) Providing a semiconductor substrate defining a device region and an outer region at a periphery of the device region. (2) Forming a first align trench in the outer region and a dummy trench in the device region. (3) Forming an epi layer over a top surface of the semiconductor substrate and within the dummy trench. (5) Forming a current path changing part over the epi layer. (5) Forming a gate electrode on the current path changing part, wherein when the epi layer is formed a current path changing trench corresponding to the dummy trench is formed over the epi layer, and the current path changing part is formed within the current path changing trench.

In embodiments, a semiconductor device may include at least one of: (1) A semiconductor substrate defining a device region and an outer region at a periphery of the device region. (2) An epi layer over the semiconductor substrate. (3) A current path changing part within the epi layer in the device region. (4) An align part within the epi layer in the outer region. (5) A gate electrode over the current path changing part. (6) A source region in at least one of the sides of the gate electrode. (7) A drain region in at least one of the sides of the current path changing part.

In embodiments, a semiconductor device may include at least one of: (1) A semiconductor substrate over which a dummy trench is disposed. (2) An epi layer over the semiconductor substrate. (3) A current path changing part disposed within the epi layer and corresponding to the dummy trench. (4) A gate electrode on the current path changing part. (5) A source region at a side of the gate electrode. (6) A drain region in at least one of the sides of the current path changing part.

The details of embodiments are set forth in the accompanying drawings and the description below. Other features may be apparent from the description, drawings, and the claims.

DRAWINGS

DESCRIPTION

In the description of embodiments, it may be understood that when a substrate, layer, film, or electrode is referred to as being 'on' and/or 'over' or 'under' another substrate, layer, film, or electrode, the terminology of 'on' and/or 'over' and 'under' includes both the meanings of 'directly' and 'indirectly'. Further, the reference about 'on' and/or 'over' and 'under' each component will be made on the basis of drawings. In addition, the sizes of elements and the relative sizes between elements may be exaggerated for further understanding of the present disclosure.

Figure 1:
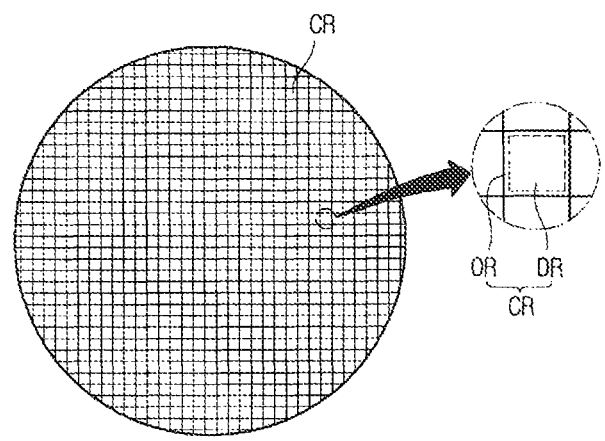
FIGS. 1 to 8 illustrate a process of fabricating a relatively high voltage transistor, in accordance with embodiments.

FIGS. 1 to 8 illustrate a process of fabricating a relatively high voltage transistor according to embodiments. Referring to FIG. 1, a semiconductor substrate 100 is provided. The semiconductor substrate 100 may be a silicon substrate. The semiconductor substrate 100 may include a plurality of chip regions CR. The chip regions CR may be formed by dividing the semiconductor substrate 100 into a matrix form. Accordingly, the chip regions CR may have rectangular or square shapes. Each of the chip regions CR may include a device region DR and an outer region OR. The device region DR may be defined as the central portion of the chip region CR. The device region DR substantially may take most of the chip region CR.

Figure 2:
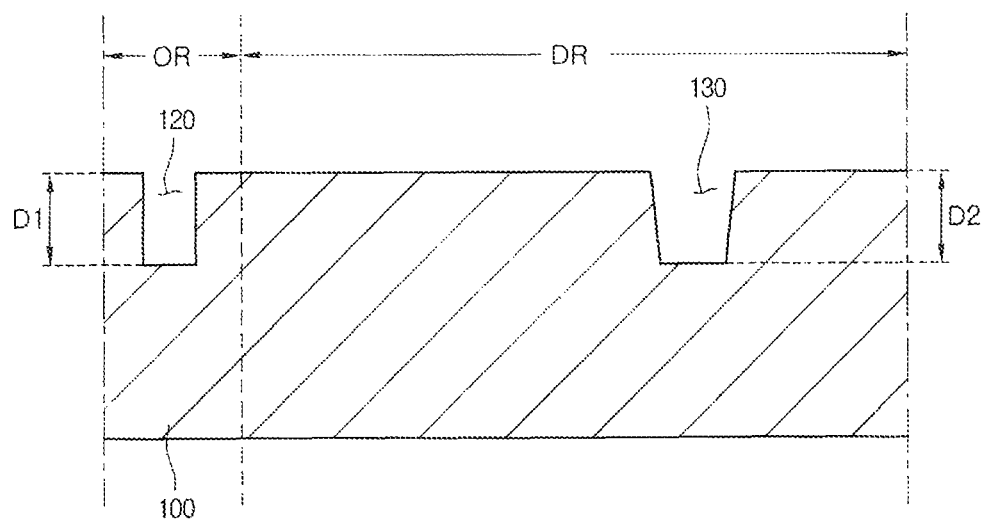

The semiconductor substrate 100 may include a p type impurity. For example, the semiconductor substrate 100 may be a p type silicon substrate. Referring to FIG. 2, a first align trench 120 and a dummy trench 130 are formed on the semiconductor substrate 100. The first align trench 120 and the dummy trench 130 may be simultaneously formed. For example, the first align trench 120 and the dummy trench 130 may be formed using substantially the same mask through substantially the same process.

The first align trench 120 may be disposed in the outer region OR. The first align trench 120 may function as a align key in a subsequent photolithography process. The first align trench 120 may have a depth D1 ranging from about 3000 Å to about 4000 Å.

The dummy trench 130 may be disposed in the device region DR. The dummy trench 130 may have a depth D2 that may correspond to the depth D1. For example, the depth D2 may be substantially equal to the depth D1. For example, the depth D2 may be substantially equal to the depth D1 with a tolerance (for example, 2%) allowed by a person skilled in the art. The depth D2 may range from about 3000 Å to about 4000 Å.

Figure 3:
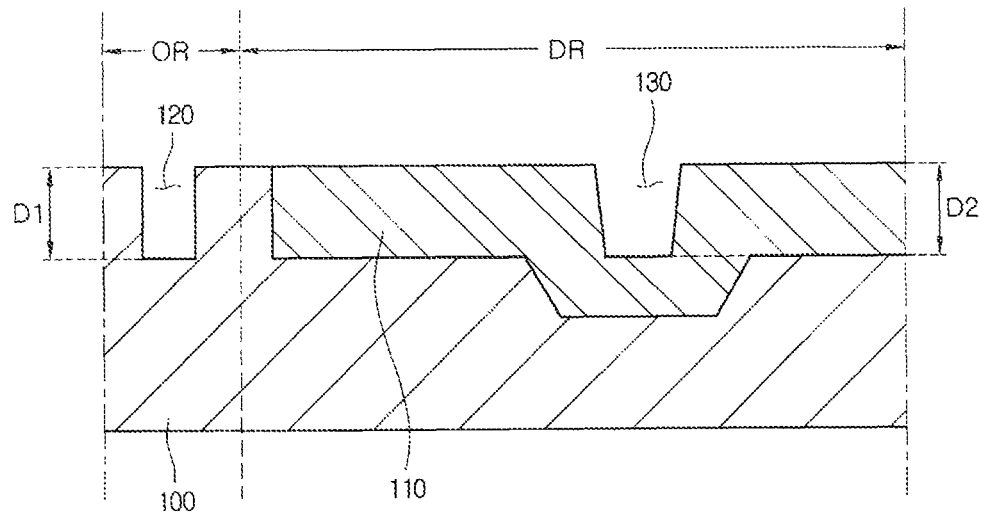

Referring to FIG. 3, a relatively high concentration of n type impurity may be implanted and diffused in the semiconductor substrate 100, so as to form a buried layer 110. In embodiments, the n type impurity may be implanted in the upper portion of the semiconductor substrate 100. The n type impurity may be implanted under the dummy trench 130.

Accordingly, the buried layer 110 may be formed under the dummy trench 130. The buried layer 110 may have a bent portion conforming to the dummy trench 130. For example, the portion of the buried layer 110 corresponding to the dummy trench 130 may protrude downward. Since the buried layer 110 may include relatively high concentration of the n type impurity, the buried layer 110 may have a device isolation function.

Figure 4:
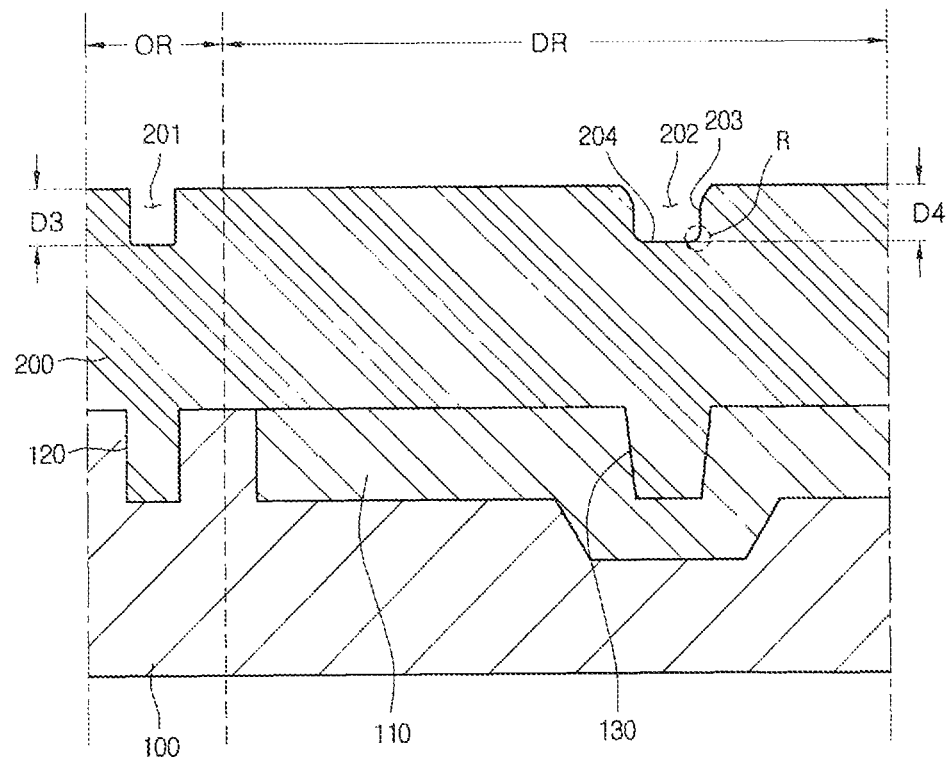

Referring to FIG. 4, an epi layer 200 may be formed on the semiconductor substrate 100. The epi layer 200 may be also formed within the first align trench 120 and the dummy trench 130. For example, the epi layer 200 may fill the first align trench 120 and the dummy trench 130.

The epi layer 200 may be grown through an epitaxial process from the top surface of the semiconductor substrate 100, the inner surface of the first align trench 120, and the inner surface of the dummy trench 130. For example, the epi layer 200 may be formed through a vapor phase epitaxy (VPE) process or liquid phase epitaxy (LPE) process using a p type impurity. The epi layer 200 may be grown laterally or upwardly from the inner surface of the first align trench 120, and the inner surface of the dummy trench 130. Accordingly, a second align trench 201 that may be relatively smaller than the first align trench 120 may be formed on the epi layer 200.

The second align trench 201 may be disposed in a position corresponding to the first align trench 120. A current path changing trench 202 that may be relatively smaller than the dummy trench 130 may be formed on the epi layer 200. The current path changing trench 202 may correspond to the dummy trench 130.

The epi layer 200 may be grown from the side and bottom surfaces of the dummy trench 130. Accordingly, a corner of the current path changing trench 202 may be rounded. For example, a portion R where a side surface 203 and a bottom surface 204 of the current path changing trench 202 may be connected to each other may be rounded. The side surface 203 of the current path changing trench 202 may be slightly inclined.

A depth D3 of the second align trench 201 may be relatively smaller than the depth D1 of the first align trench 120. A depth D4 of the current path changing trench 202 may be relatively smaller than the depth D2 of the dummy trench 130. The depth D3 of the second align trench 201 may range from about 2000 Å to about 2500 Å. The depth D4 of the current path changing trench 202 may range from about 2000 Å to about 2500 Å.

The depth D3 of the second align trench 201 may correspond to the depth D4 of the current path changing trench 202. For example, the depth D4 of the current path changing trench 202 may be substantially the same as the depth D3 of the second align trench 201.

Figure 5:
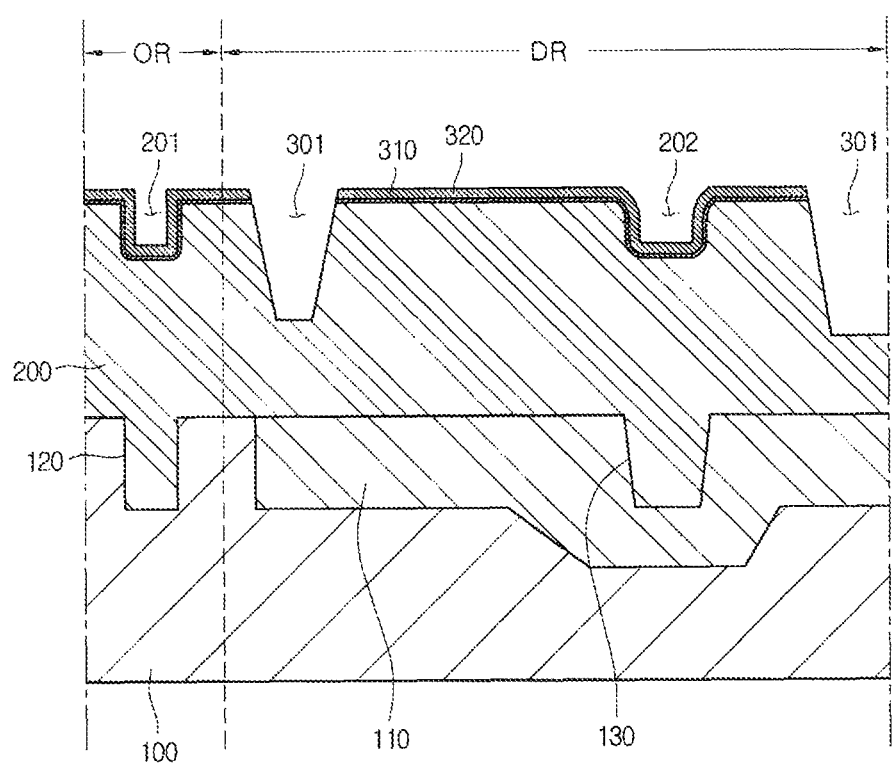

Referring to FIG. 5, an oxide layer 310 and a nitride layer 320 may be sequentially formed on the epi layer 200. The oxide layer 310 and the nitride layer 320 may also be formed within the second align trench 201 and the current path changing trench 202. Accordingly, a device isolation trench 301 may be formed on the epi layer 200. A depth of the device isolation trench 301 may be relatively greater than the depth D4 of the current path changing trench 202.

Figure 6:
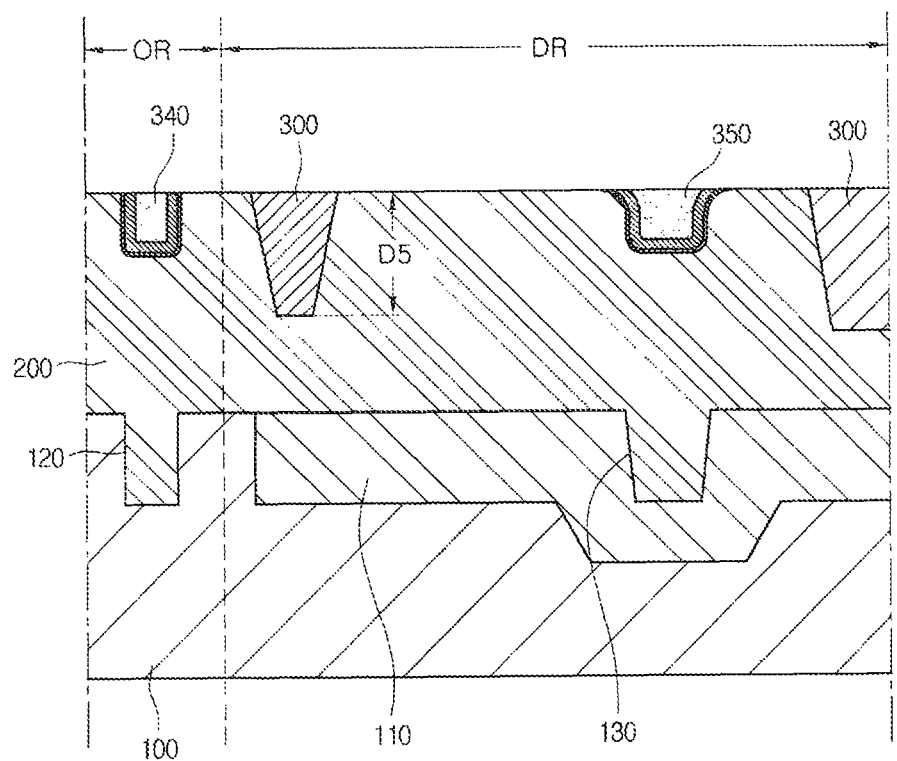

Referring to FIG. 6, a first insulation part 340, a second insulation part 350, and a device isolation layer 300 may be formed within the second align trench 201, the current path changing trench 202, and the device isolation trench 301, respectively. An insulating material may be deposited entirely on the epi layer 200. The insulating material may fill the second align trench 201, the current path changing trench 202, and the device isolation trench 301.

The portion of the insulating material formed on the top surface of the epi layer 200 may be removed through a chemical mechanical polishing (CMP) process. For example, the top surface of the epi layer 200 may be planarized through the CMP process.

As a result, an align part 400 may be disposed within the second align trench 201, and a current path changing part 500 may be disposed within the current path changing trench 202. The align part 400 may include a portion of the oxide layer 310 and the nitride layer 320, and the first insulation part 340. The current path changing part 500 may include a portion of the oxide layer 310 and the nitride layer 320, and the second insulation part 350. Current path changing part 500 may be formed through the CMP process the top surface of the current path changing part 500 may be flush with the top surface of the epi layer 200.

Figure 7:
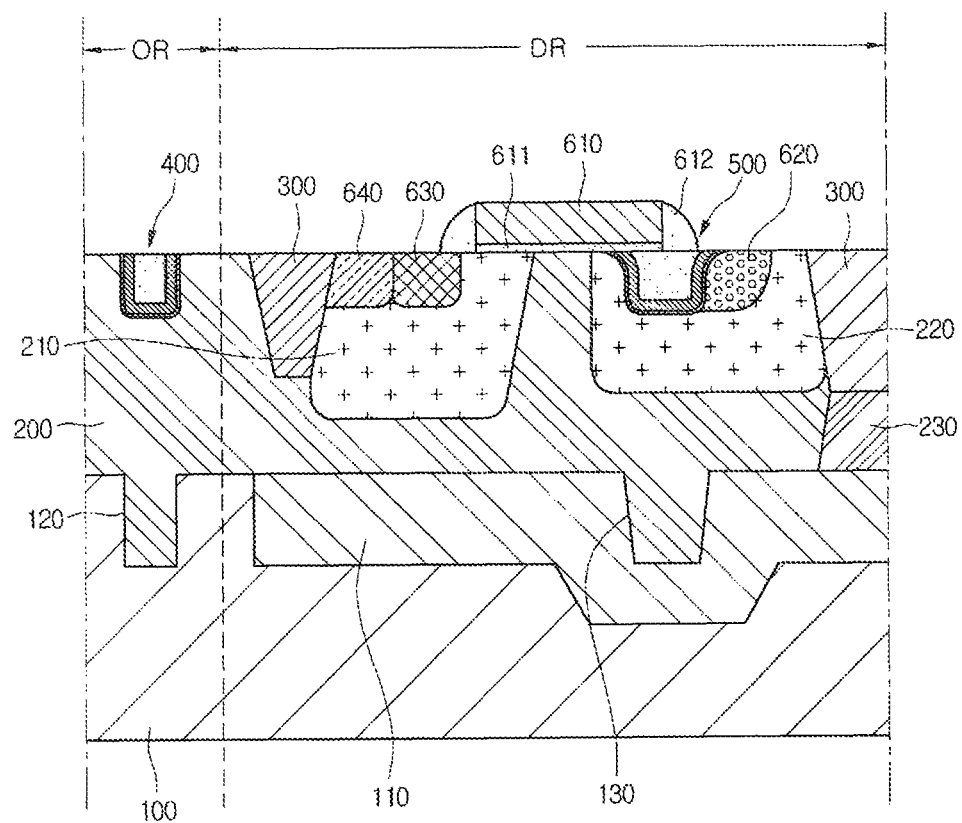

Referring to FIG. 7, a relatively low concentration of the p type impurity may be implanted in the epi layer 200, so as to form a p type body 210. A relatively low concentration of the n type impurity may be implanted in the epi layer 200, so as to form an n type drift region 220. A heat treatment process may be added to diffuse the n type impurity and the p type impurity. A gate electrode 610 may be disposed between the p type body 210 and the n type drift region 220.

A gate dielectric layer 611 may be formed over the epi layer 200, and the gate electrode 610 may be formed on the gate dielectric layer 611. The gate electrode 610 may be formed on the current path changing part 500. The gate electrode 610 may overlap the current path changing part 500. After that, spacers 612 may be formed on the gate electrode 610. The spacers 612 may be formed through an etch back process.

A relatively high concentration of the n type impurity may be implanted into both sides of the gate electrode 610, so as to form a source region 630 and a drain region 620. The drain region 620 may be adjacent to the current path changing part 500. The current path changing part 500 may be disposed between the source region 630 and the drain region 620. A relatively high concentration of the p type impurity may be implanted into the p type body 210 at a side of the source region 630 to form a body contact 640.

Figure 8:
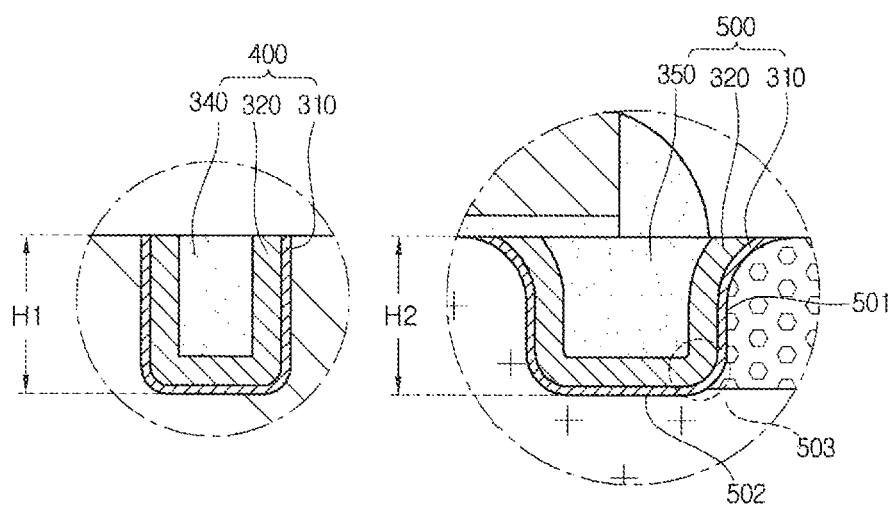
Figure 9:
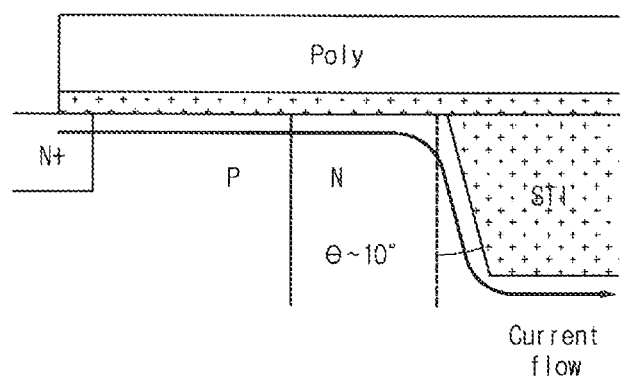
FIGS. 9 and 10 are cross-sectional views that illustrate a relatively high voltage device, in accordance with the related art.
Figure 10:
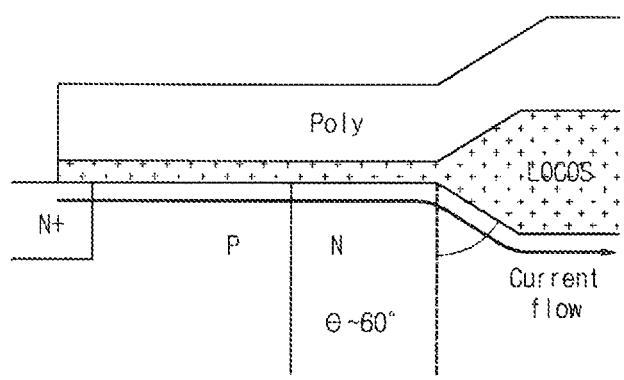

Referring to FIGS. 7 and 8, a height H1 of the align part 400, that is, a distance from the top surface of the align part 400 to the bottom surface thereof is substantially equal to a height H2 of the current path changing part 500. For example, the height H1 as a distance from the top surface of the epi layer 200 to the bottom surface of the align part 400 may correspond to the height H2 as a distance from the top surface of the epi layer 200 to the bottom surface of the current path changing part 500.

The height H2, as the distance from the top surface of the epi layer 200 to the bottom surface of the current path changing part 500, may range from about 2000 Å to about 2500 Å. A portion 503 where a bottom surface 502 and a side surface 501 of the current path changing part 500 may be connected to each other may be rounded. As a result, the current path changing part 500 may be entirely rounded.

Electric current applied to the drain region 620 may efficiently flow along the side surface 501 and the bottom surface 502. Accordingly, a relatively high voltage transistor according to the current embodiment may minimize on-resistance (Ron).

The current path changing trench 202 may be formed conforming to the dummy trench 130. Thus, the dummy trench 130 may correspond to the current path changing part 500. From a plain view, the position of the current path changing part 500 may be substantially the same as that of the dummy trench 130.

The relatively high voltage transistor according to the current embodiment may change a current path between the source region 630 and the drain region 620, by using the current path changing part 500. The current path changing part 500 may be disposed under the gate electrode 610, and more particularly, under the gate dielectric layer 611 to move a path of current flowing through a channel, in a direction away from the gate dielectric layer 611. Thus, the relatively high voltage transistor according to the current embodiment may prevent damages around the gate dielectric layer 611 due to relatively high driving voltage, and have a relatively high breakdown voltage.

In the method of fabricating the relatively high voltage transistor according to the current embodiments, the dummy trench 130 may be formed simultaneously with the formation of the first align trench 120, and the current path changing trench 202 may be formed using the dummy trench 130. As a result, the current path changing part 500 is formed within the current path changing trench 202. The same mask as that for the first align trench 120 may be used.

In some designs, in the method of fabricating relatively high voltage transistor according to the current embodiments, the current path changing part 500 may be formed to a desired depth without an additional process. Thus, a semiconductor device having a minimized current path and a maximized breakdown voltage may be efficiently formed.

It will be obvious and apparent to those skilled in the art that various modifications and variation can be made in the embodiments disclosed. Thus it is intended that the disclosed embodiments cover the obvious and apparent modifications and variations, provided that they are within the scope of the appended claims and their equivalents.

What is claimed is:

1. A method of fabricating a semiconductor device, comprising:
    providing a semiconductor substrate with a defined device region and a defined outer region, wherein the outer region is at a periphery of the device region;
    forming a first align trench in the outer region;
    forming a dummy trench in the device region;
    forming an epitaxial layer over a top surface of the semiconductor substrate and within the dummy trench;
    forming a current path changing portion over the epitaxial layer; and
    forming a gate electrode over the current path changing portion,
    wherein when the epitaxial layer is formed, a current path changing trench corresponding to the dummy trench is formed on the epitaxial layer, and the current path changing portion is formed within the current path changing trench.

2. The method according to claim 1, wherein when the epitaxial layer is formed, a portion where a bottom surface and a side surface of the current path changing trench are connected to each other is rounded.

3. The method according to claim 1, wherein when the epitaxial layer is formed, the epitaxial layer is formed within the first align trench.

4. The method according to claim 1, comprising forming a buried layer in the device region, wherein the forming of the buried layer comprises:
    implanting a conductive type impurity into an upper portion of the semiconductor substrate and under the current path changing trench; and
    diffusing the conductive type impurity.

5. The method according to claim 1, comprising:
    forming a drain region on at least one of the sides of the current path changing part; and
    forming a source region on at least one of the sides of the gate electrode.

6. The method according to claim 1, wherein an align part corresponding to the first align trench is formed on the epitaxial layer.

7. The method according to claim 6, wherein the align part and the current path changing part are simultaneously formed.

8. The method according to claim 7, wherein the epitaxial layer comprises a second align trench corresponding to the first align trench.

9. The method according to claim 8, wherein the forming of the align part and the current path changing part comprises:
    forming an oxide layer over the epitaxial layer, within the current path changing trench, and within the second align trench;
    forming a nitride layer over the oxide layer; and
    forming a first insulation part within the second align trench, and a second insulation part within the current path changing trench.

* * * * *